United States Patent [19]

Jeng

[11] Patent Number: 4,809,246

[45] Date of Patent: Feb. 28, 1989

[54] SOUND ILLUSTRATED BOOK HAVING PAGE INDICATOR CIRCUIT

[76] Inventor: Lih Jeng, 5, Lane 4, Lung-Meng St., Lung-Tan, Taoyuan Hsien, Taiwan

[21] Appl. No.: 42,466

[22] Filed: Apr. 24, 1987

[51] Int. Cl.⁴ .............................................. G09B 5/06
[52] U.S. Cl. ...................................... 434/317; 40/906; 281/15 R; 281/42; 369/31
[58] Field of Search ........................... 369/31, 64, 76; 434/317, 318; 40/124.1, 455, 906; 281/15 R, 42

[56] References Cited

U.S. PATENT DOCUMENTS

| | | | |
|---|---|---|---|
| 3,220,126 | 11/1965 | Gabrielsen | 434/317 |
| 3,529,832 | 9/1970 | Goetz et al. | 369/31 |
| 4,299,041 | 11/1981 | Wilson | 40/906 |
| 4,636,881 | 1/1987 | Brefka et al. | 369/31 |

Primary Examiner—William H. Beha, Jr.
Attorney, Agent, or Firm—Ostrolenk, Faber, Gerb & Soffen

[57] ABSTRACT

A sound illustrated book comprises a plurality of sheets bearing printed matter, a page indicator circuit, and an audio sound reproducing circuit. The page indicator circuit comprises a code generator, and a decoder. An unique code is generated by said code generator, when the book is opened to any one of said sheet. Said unique code is transmitted to said decoder, and a pre-recorded message related to the matter printed on said any one of said sheets is played by said audio sound reproducing circuit according to a decoded signal from said decoder.

8 Claims, 6 Drawing Sheets

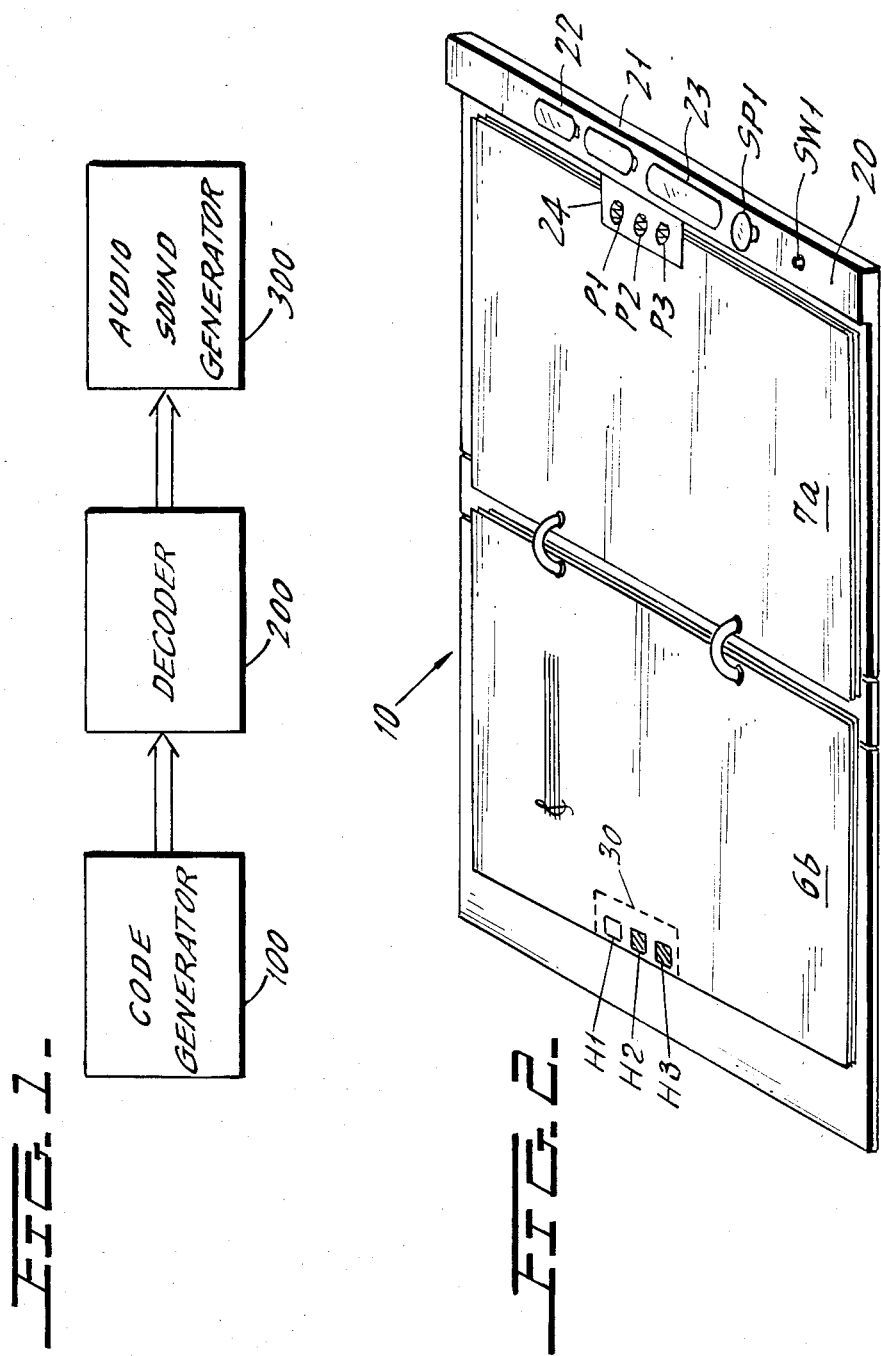

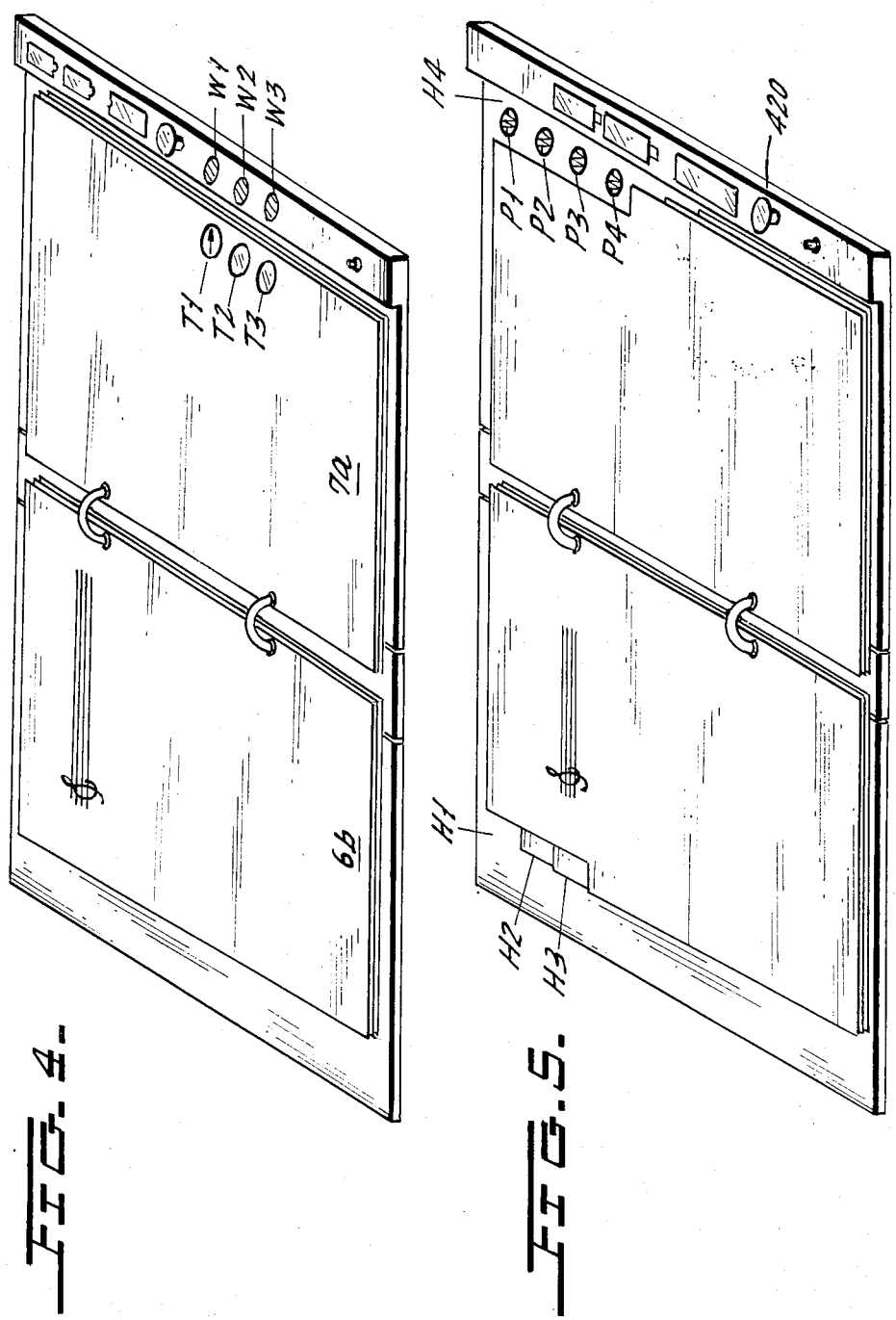

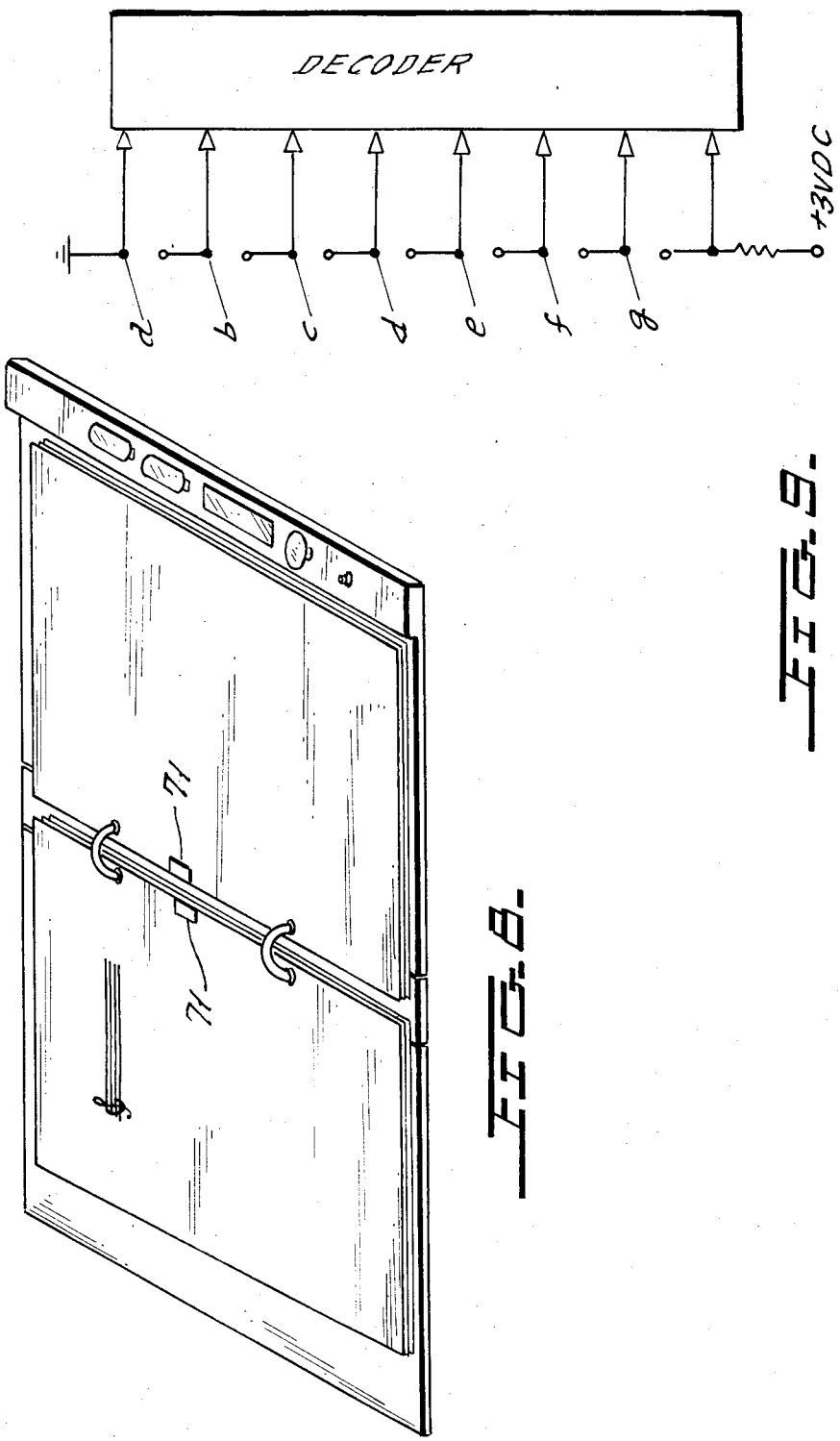

4,809,246

SOUND ILLUSTRATED BOOK HAVING PAGE INDICATOR CIRCUIT

BACKGROUND OF THE INVENTION

The present invention pertains generally to the field of sound illustrated books and more particularly to an improved sound illustrated book which contains a page indicator circuit for easily identifying the pages opened and signalling an audio sound reproducing circuit to play a pre-recorded message related to the matter printed on said pages. Above said books can be various kinds of books such as song book, story book for children, and manual, etc..

U.S. Pat. No. 3,529,832 discloses a sound illustrated book which contains indicator means rotatably mounted in juxaposed page-apertures bearing indicia with which indicator means to reproduce recorded messages corresponding to printed matter on a particular page.

Sound illustrated books of the type disclosed in said patent have the disadvantages that they are complicated in structure and for operation and they have a somewhat big aperture on each sheet occupying the printing space and a somewhat big housing for the sound reproducing means.

SUMMARY OF THE INVENTION

The major object of the present invention is to provide a new and improved sound illustrated book not subject to the disadvantages enumerated above.

Another object of the present invention is to provide a sound illustrated book which is convenient to carry and operate.

A further object of the present invention is to provide a sound illustrated book which is able to detect the abnormal illumination.

According to the present invention, a sound illustrated book comprises a plurality of sheets bearing printed matter, an audio sound reproducing circuit having recorded messages related to said printed matter, and a page indicator circuit, characterized in that said page indicator circuit comprises:

a decoder connected to said audio sound reproducing circuit; and a code generator connected to said decoder, which generates an unique code corresponding to any one of the sheets which is opened; wherein
said unique code is transmitted to said decoder, and a recorded message related to the matter printed on said any one of the sheets which is opened is played by said audio sound reproducing circuit according to a decoded signal from said decoder.

Said audio sound reproducing circuit comprises a plurality of integrated circuits and an amplifier-speaker circuit. Each of said integrated circuits contains a recorded message related to the matter printed on a corresponding sheet of said book, and one of said recorded message is amplified to generate audio sound through said amplifier-speaker circuit according to said decoded signal.

Said code generater has various preferred embodiments such as apertures-photosensitive type, push type, and conductor type. The apertures-photosensitive type comprises a photosensitive elements array and a perforated block on the same position of each sheet of said book, wherein said block has differently arranged apertures. Different codes are generated when the photosensitive elements are placed under the perforated blocks on different sheets with adequate intensity of light on the photosensitive elements. In the case of the number of the elements of said array is three, there are eight different arrangement of apoertures to expose the photosensitive elements of said array and consequently eight different codes can be generated. Similarily, a push type switchs array with different indicative push marks on each sheet of said book will have the same function as above said apertures-photosensitive type. The conductor type of said code generator comprises a conductor riveted at substantially the same location of each sheet of said book and a power source connected to the conductor on the last (or first)sheet through a pull-up resistor, said conductors of every next two sheets contact each other as the book is closed. If the book is opened to one of the sheets, for example between sheet 5 and 6, the sheets from 1 to 5 will have a lower (or higher) potential and sheet 6 to the last sheet will have a higher (or lower) potential. Thus, an unique code will be generated corresponding to the sheet which is opened. Similarily, a photosensitive elements array with the amount of the photosensitive elements being equal to the sheet lined up under the last sheet and each of the sheets having the apertures equal to its sheet number with the apertures aligned with and on the top of the photosensitive elements will generate the same type of codes as the conductor type, when the book is opened and under adequate illumination.

Said decoder is a conventional electric circuit which has the function of identifying the electrical potentials differences between different codes generated by said code generator and selecting a particular portion of said audio sound reproducing circuit to play a message corresponding to the code.

It is apparent that the decoder may be not needed in achieving the goals of the present invention, if a photosensitive element is attached on each sheet of said book and directly connected to the audio sound reproducing circuit. But is will lead to a somewhat more complicated and expensive way to manufacture.

The feature and advantages of the present invention will become more apparent from the following detailed description of the preferred embodiments, taken in conjunction with the drawings.

BRIEF DESCRIPTION OF THE DRAWINGS

FIG. 1 is a block diagram of a sound illustrated book embodying this invention.

FIG. 2 is a perspective view of a sound illustrated book according to Example 1.

FIG. 4 is a perspective view of a sound illustrated book according to Example 2.

FIG. 5 is a perspective view of a sound illustrated book according to Example 3.

FIG. 8 is a sound illustrated book according to Example 4.

FIG. 9 is a circuit diagram of the code generator used in FIG. 8.

DESCRIPTION OF THE PREFERRED EMBODIMENTS

Figure 3:
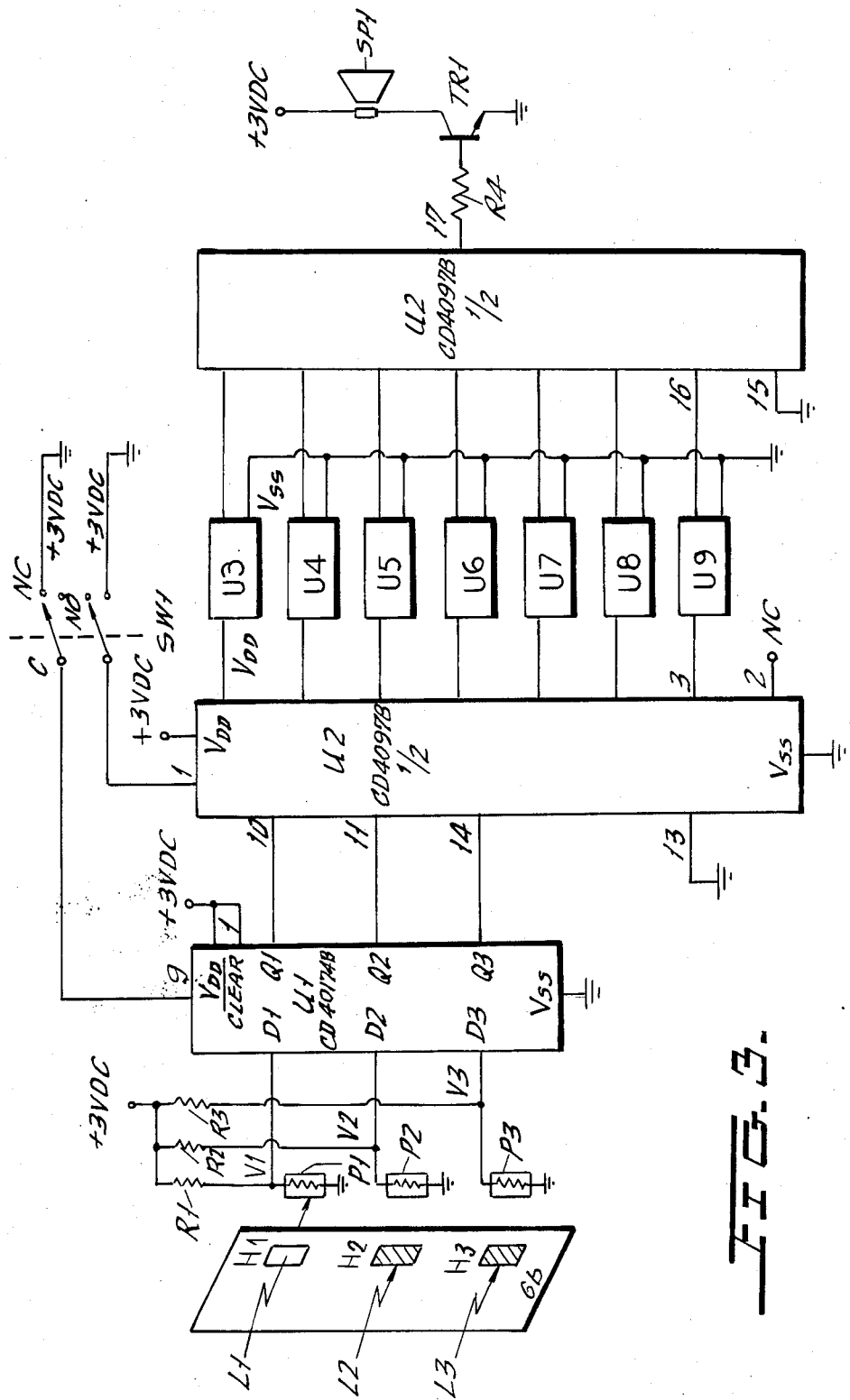
FIG. 3 is a electric circuit diagram of the book shown in FIG. 2.

Referring to FIG. 1, a block diagram embodying this invention is shown therein and consists of a code generator 100, a decoder 200, and an audio sound reproducing circuit 300. An unique code is generated by the code generator 100, when the sound illustrated book is opened to any one of its sheet. Said unique code is transmsitted to the decoder 200 which outputs a decoded signal to actuate the audio sound reproducing circuit 300 to play a pre-recorded message which is related to the printed matter on the sheet opened. The following examples illustrate the preferred embodiments according to the present invention.

EXAMPLE 1

As shown in FIG. 2, a sound illustrated song book 10 consists of two covers, seven inner sheets, and a music box 20 mounted on the inside surface of the bottom cover and near the cover edge. The top cover of said book is larger than inner sheets and equal to the bottom cover, so the music box 20 is covered as the book is closed.

Each of the seven inner sheets has a perforated block 30 located at the center of the outer vertical edge. In the perforated block 30, there are three possible punched places H1, H2, and H3 respectively. On page 6b in FIG. 2, the H1 is perforated and the H2, H3 having oblique parallel lines are not perforated.

Said music box 20 has a transparent top cap 21 for the purpose of exposing the arrangement inside the box, which contains batteries 22, a electric circuit board 23, a speaker SP1, a switch SW1, and a photosensitive plate 24 having three photo resistors P1, P2, P3 respectively. Said photosensitive plate 24 is pivotally connected to the top cap 21 with the photo resistors aligned with said punched places respectively. The working electric circuit diagram of the book 10 is shown in FIG. 3.

The perforated block 30 is laid on the photosensitive plate 24 and the punched places H1, H2, and H3 are on the top of photo resistors P1, P2, and P3 respectively, while the page 6b is turned over the page 7a. One end of each photo resistors P1, P2, P3 is grounded, and the other end is connected both to +3VDC power source through a pull-up resistor R1, R2, R3 respectively and to the D-type Flip-Flop(RCA CD40174B) U1. The CLEAR signal of U1-1 is connected to +3VDC. Because only H1 is perforated, among light L1, L2, and L3 only light L1 passes through the aperture of H1 and is on the photo resistor P1, the resistance of the photo resistor P1 decreases. Consequently, V1 is the only one having the lower electric potential among V1,V2, and V3. So the input data of the D-type Flip-Flop U1 are D1=0, D2=1 and D3=1, in binary system it is 110, and 6 decimal system. Before the double-throw spring switch SW1 is pressed, the CLOCK of U1-9 is grounded. When it is pressed, the U1-9 is connected to +3VDC. Because U1 is positive edge D-type flip-flop, the data D1, D2 and D3 are locked at the output terminal Q1, Q2 and Q3 respectively as the CLOCK is changed from lower electric potential to higher electric potential.

IC U2 is a Dual 1-of-8 Analog Switch (RCA CD4097B). When the signals of Q1, Q2 and Q3 are transmitted to U2-10, U2-11 and U2-14, said signals are decoded because U2-13 inhibit signal is grounded. In the present example the signals of U2-10, U2-11 and U2-14 is 110 (6 in decimal system), so the U2-1 is connected to U2-3 and U2-16 is connected to U2-17.

When switch SW1 is released, it jumps back to the original state and U2-1 is connected to +3VDC. Consequently, U9 is energized through U2-3 and output the pre-recorded music signals. Said music signals are transmitted through U2-16, U2-17 and resistor R4 to transistor TR1 and speaker SP1 to generate audio sound.

The U3 to U9 IC are products of United Microelectronic Corporation, Taiwan, series UM66T, and they have been used in an excess amount in music greeting cards or music cups. They are designed to have autostop function, so no audio sound will be generated when said music signals are finished. If the operator presses the switch SW1 again, said book will replay the same message. If the operator turns the book 10 to another sheet with the photosensitive plate also right under the preforated block 30 of said another sheet, the book will play another song corresponding to said another sheet as the switch SW1 is pressed because of the unique punching situation in the perforated block of said another page.

Because U2-2 is non-connected and U2-15 is grounded, there will be no sound generated as said book is closed. It is apparent that an additional sight protection effect may be obtained if the photosensitivity of said photo resistors are controlled between the adequate illumination range.

EXAMPLE 2

The sound illustrated book as shown in FIG. 4 of this present example is similar to the one of example 1. The three punching places H1, H2 and H3 of FIG. 2 are replaced by three push labels, T1, T2 and T3 and the three photo resistors P1, P2 and P3 are replaced by three push-button switches W1, W2 and W3 respectively. The push labels on each sheet have different arrangement of indicative marks, such as sheet 7a in FIG. 4, an arrow is on T1 and none on T2, T3.

An unique code will be generated when the operator opens the book to any one of the sheets and presses or pushes the push-button switches according to the arrow indicators on the push labels. As example 1, the unique code is transmitted to a decoder which outputs a decoded signal to an audio sound reproducing circuit to play a pre-recorded message corresponding to the signal.

EXAMPLE 3

This example discloses a sound illustrated book with another type of page indicator circuit according to the present invention.

Figure 6:
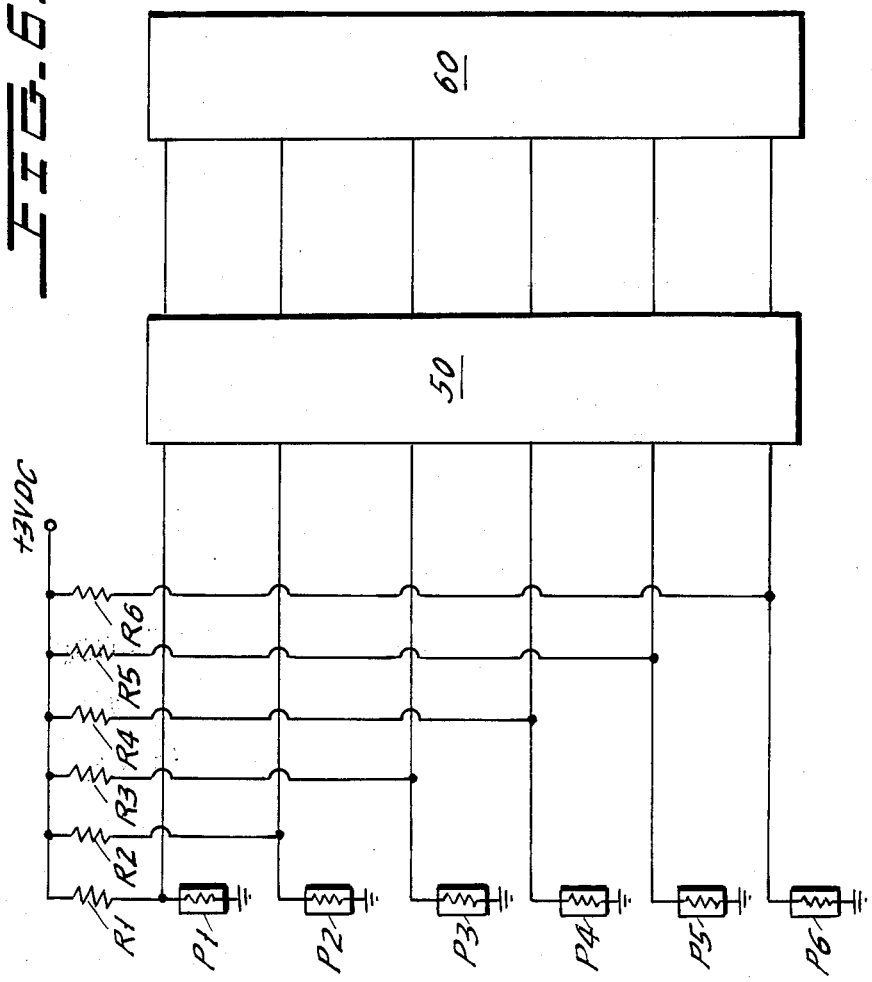
FIG. 6 is a simplified circuit diagram of the book shown in FIG. 5.

Referring to FIG. 5, a sound illustrated book has a photo resistors array of six photo resistors fixed near the music box 420 on the inside surface of the bottom cover. Four of the photo resistors of said array are exposed and designated P1, P2, P3 and P4 respectively. At the upper outer corner of each sheet of said book there is a cut which allows the photo resistors of said array to be exposed with the number of the exposed photo resistors being equal to the sheet number. The cuts of sheet 1 to sheet 4 are designated H1 to H4 respectively. With respect to FIG. 6 drawings, one end of each photo resistor of P1, P2, . . . to P6 is grounded and the other end is connected both to +3VDC through a pull-up resistor of R1, R2, . . . to R6 respectively and to a decoder 50. So an unique code is generated as the operator opens the book to any one of its sheets. In FIG. 5 drawing, the code generated by said photo resistors array is 000011, wherein 0 represents lower electric potential and 1 represents higher electric potential.

Figure 7:
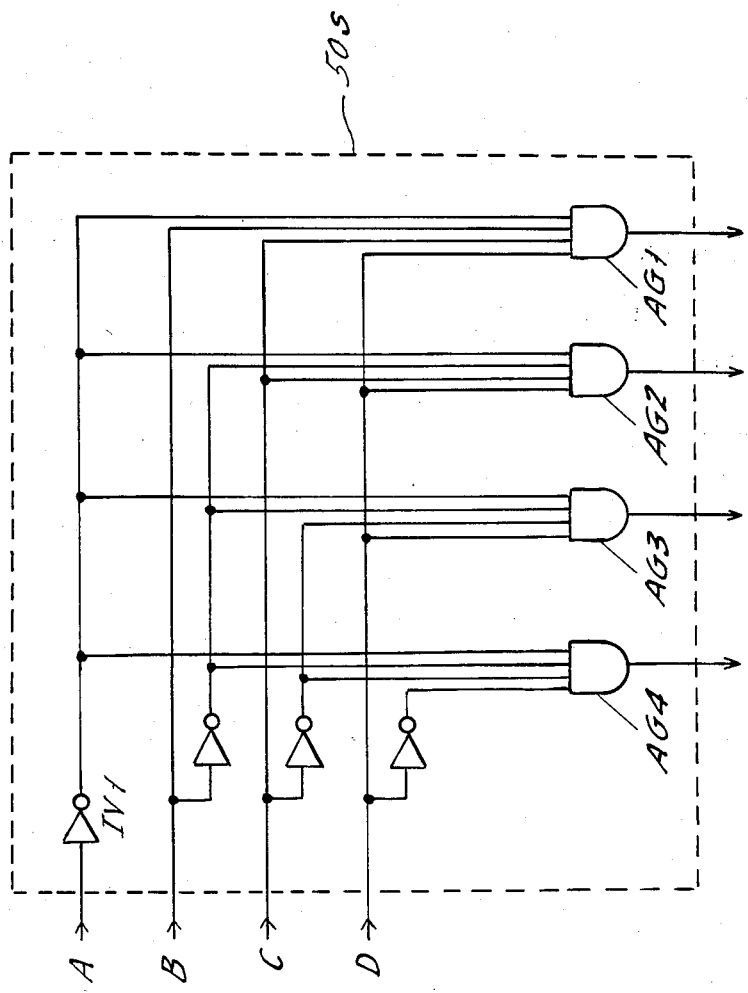
FIG. 7 is a circuit diagram of the type of decoder suitable for using in FIG. 6.

Said unique code generated by the photo resistors array is transmitted to the decoder 50 which outputs a decoded signal to an audio sound reproducing circuit 60 to play a pre-recorded message according to said decoded signal. A simplified decoder circuit diagram dealing with four inputs signals is shown in FIG. 7 to illustrate how the unique code is decoded by the decoder 50. In FIG. 7, four signals A, B, C and D generated by four photo resistors are transmitted to the decoder 50S. The codes generated by the present example with four photo resistors of said array will consist of the following four different modes:

(1) 0111 for opening to sheet 1;
(2) 0011 for opening to sheet 2;
(3) 0001 for opening to sheet 3; and
(4) 0000 for opening to sheet 4.

In the case of (1), the signal of A is 0 which is inverted to 1 by the inverter IV1 and transmitted to an AND gate AG1, and the signals of B, C and D are 1 which are directly transmitted to the AND gate AG1. So the output signal of AND gate AG1 is 1, and the output signals of the rest of the AND gates AG2, AG3 and AG4 are 0 respectively. Similarily, in case (2) only the output signal of AND gat AG2 is 1, and in case (3) or (4) also only the output signal of AND gate AG3 or AG4 is 1. It is understood that the decoder 50S has a function to decode the codes consist of different levels of electric potentials.

EXAMPLE 4

This example is intended to illustrate a sound illustrated book with a new type of switches array which will generate the same type of codes as example 3.

With respect to FIG. 8, a small aluminum sheet 71 snaps at the inner edge of each sheet with the aluminum sheets of every next two sheets contacting each other as the book is closed. The aluminum sheet on each sheet is connected to a decoder similar to the one shown in FIG. 7. The aluminum sheet on the last sheet is also connected to a power source through a pull-up resistor. The circuit diagram of said switches array is shown in FIG. 9, wherein a switches array designated by a through g are created by the aluminum sheets 71 between every next two sheets. If the operator opens the book to sheet 2, the switch a is disconnected and the switches b through g are connected to the power source. So corresponding to the sheet which is opened, an unique code like example 3 will be generated.

While preferred embodiments of this invention have been disclosed herein, those skilled in the art will appreciate that changes and modifications may be made therein without departing from the spirit and scope of this invention as defined in the appended claims.

What I claim as my invention is:

1. A sound illustrated book comprises a plurality of sheets bearing printed matter, an audio sound reproducing circuit having recorded messages related to said printed matter, and a page indicator circuit, characterized in that said page indicator circuit comprises:
  a decoder connected to said audio sound reproducing circuit; and
  a code generator connected to said decoder, which generates an unique code corresponding to any one of the sheets which is opened; wherein
  said unique code is transmitted to said decoder, and a recorded message related to the matter printed on said any one of the sheets is played by said audio sound reproducing circuit according to a decoded signal from said decoder.

2. A sound illustrated book according to claim 1 wherein said audio sound reproducing circuit comprises a plurality of integrated circuits and an amplifier-speaker circuit, each of said integrated circuits containing a recorded message related to the matter printed on a corresponding sheet of said book, in which one of said integrated circuits is in series connected between said decoder and said amplifier-speaker circuit, and the message contained by said one of said integrated circuits is amplified to generate audio sound through said amplifier-speaker circuit according to said decoded signal.

3. A sound illustrated book according to claim 1 wherein said code generator comprises a photosensitive elements array and a perforated block having differently arranged apertures on each sheet of said book, in which one end of each photosensitive element of said array is grounded and the other end is connected both to a power source through a pull-up resistor and to said decoder, and said unique code is generated as the photosensitive elements array is placed under the perforated block of said any one of the sheets with adequate illumination.

4. A sound illustrated book according to claim 1 wherein said code generator comprises a differently arranged indicative push marks on each sheet of said book, and a push-button switches array aligned with said marks, whereby said unique code is generated as the push-button switches array is pushed according to the differently arranged indicative push marks of said any one of the sheets which is opened.

5. A sound illustrated book according to claim 1 wherein said code generator comprises a photosensitive elements array with the amount of the photosensitive elements being equal to the amount of the sheets lined up under the last sheet of said book and a plurality of apertures on each sheet of said book with the amount of the apertures on each sheet being equal to its sheet number, in which one end of each said photosensitive element is grounded and the other end is connected both to a power source through a pull-up resistor and to said decoder, said apertures on each sheet are aligned with and on the top of the photosensitive elements respectively, and said unique code is generated as said any one of the sheets which is opened is under adequate illumination.

6. A sound illustrated book according to claim 1 wherein said code generator comprises a conductor riveted at substantially the same location of each sheet of said book and a power source. connected to the conductor on the last or first sheet through a pull-up resistor, in which said conductors of every next two sheets contact each other as the book is closed.

7. A sound illustrated book according to claim 3 wherein said photosensitive elements are actuated under the illumination suitable for healthy reading.

8. A sound illustrated book according to claim 5 wherein said photosensitive elements are actuated under the illumination suitable for healthy reading.

* * * * *